United States Patent [19]
Lu

[11] Patent Number: 6,100,735
[45] Date of Patent: Aug. 8, 2000

[54] SEGMENTED DUAL DELAY-LOCKED LOOP FOR PRECISE VARIABLE-PHASE CLOCK GENERATION

[75] Inventor: Crist Y. Lu, Mission Viejo, Calif.

[73] Assignee: Centillium Communications, Inc., Fremont, Calif.

[21] Appl. No.: 09/197,320

[22] Filed: Nov. 19, 1998

[51] Int. Cl.[7] ............................................. H03L 7/06
[52] U.S. Cl. ........................ 327/158; 327/161; 327/271; 327/277; 327/299; 375/376; 331/25; 331/DIG. 2
[58] Field of Search ........................... 327/261, 269–271, 327/276, 277, 284, 141, 155–158, 161, 291, 295, 298, 299; 375/373, 371, 376; 331/25, 11, 12, DIG. 2

[56] References Cited

U.S. PATENT DOCUMENTS

| | | | |
|---|---|---|---|
| 4,527,126 | 7/1985 | Petrich et al. | 327/158 |
| 4,704,574 | 11/1987 | Nossen | 324/76.82 |
| 5,179,303 | 1/1993 | Searles et al . | 327/277 |
| 5,353,025 | 10/1994 | Leonida | 341/122 |
| 5,452,324 | 9/1995 | Lewis et al. | 375/373 |
| 5,463,337 | 10/1995 | Leonowich | 327/158 |
| 5,537,069 | 7/1996 | Volk | 327/149 |
| 5,604,775 | 2/1997 | Saitoh et al. | 375/376 |
| 5,610,543 | 3/1997 | Chang et al. | 327/158 |
| 5,663,665 | 9/1997 | Wang et al. | 327/3 |
| 5,744,991 | 4/1998 | Jefferson et al. | 327/158 |
| 5,777,501 | 7/1998 | AbouSeido | 327/274 |

OTHER PUBLICATIONS

Maneatis and Horowitz, "Precise Delay Generation Using Coupled Oscillators", IEEE JSSC vol. 28, No. 12, Dec. 1993, pp. 1273–1282.

Christiansen, "An Integrated high Resolution CMOS Timing Geneterator Based on an Array of Delay Locked Loops", IEEE JSSC vol. 31, No. 7, Jul. 1996, pp. 952–957.

Sidiropoulos and Horowitz, "A Semidigital Dual Delay–Locked Loop", IEEE JSSC vol. 32, No. 11, Nov. 1997, pp. 1683–1692.

Primary Examiner—Timothy P. Callahan
Assistant Examiner—Minh Nguyen
Attorney, Agent, or Firm—Stuart T. Auvinen

[57] ABSTRACT

A segmented dual delay-locked-loop (DLL) has a coarse DLL and a fine DLL. Each DLL has a series of buffers, a phase detector, charge pump, and bias-voltage generator. The bias voltage controls the delay through the buffers. The bias voltage of the coarse DLL is adjusted by the phase comparator to lock the total delay through the buffers to be equal the input-clock period. The coarse DLL divides an input clock into M equal intervals of the input-clock period and generates M intermediate clocks having M different phases. An intermediate mux selects one of the M intermediate clocks in response to a phase-selecting address. The selected intermediate clock K and a next-following intermediate clock K+1 are both selected and applied to the fine DLL. The K clock is input to a series of N buffers in the fine DLL while the K+1 clock is directly input to a phase detector. The phase detector compares the K+1 clock to the K clock after the delay through the buffers. The bias voltage of the fine DLL is adjusted by the phase comparator to lock the total delay through the N buffers to the coarse interval between the K and K+1 intermediate clocks. Thus the input clock is divided into M intervals by the coarse DLL, then the fine DLL further divides one coarse interval into N intervals. Very fine phases are generated with only a M-buffer DLL and an N-buffer DLL.

20 Claims, 6 Drawing Sheets

FIG. 1

PRIOR ART

FIG. 2

PRIOR ART

SEGMENTED DUAL DELAY-LOCKED LOOP FOR PRECISE VARIABLE-PHASE CLOCK GENERATION

FIELD OF THE INVENTION

This invention relates to clock generators, and more particularly to delay-locked loops.

BACKGROUND OF THE INVENTION

Precise clocks are necessary for demanding telecom applications. Digital-Subscriber Lines (DSLs) in particular operate at high data rates and clocks must be precisely extracted from the line signal. The extracted clock is used to time the analog-to-digital converter in the receiver, or the digital-to-analog converter (DAC) in the transmitter. Of course, many other applications also require precise clocks.

The clock may need to be adjusted to stay in sync with the incoming line signal. A Phase-locked loop (PLL) could be used, but precise adjustments may be more conveniently produced without noise accumulation with a delay-locked loop (DLL). While a PLL changes the generated clock by adjusting a voltage input to a voltage-controlled oscillator (VCO), the DLL adjusts the generated clock by adjusting a bias voltage to a series of buffers.

Adjusting the bias voltage changes the delay through each of the buffers in the DLL. When the buffers are all identical, the period of the generated clock is divided into N equal phases, where N is the number of buffers in the series. A multiplexer can be used to select one of the N phases as the generated clock. Changing which buffer's output is selected by the multiplexer changes the phase of the generated clock. Stepping through a series of phases gradually reduces or increases the clock period, thus changing the frequency of the generated clock.

Figure 1:
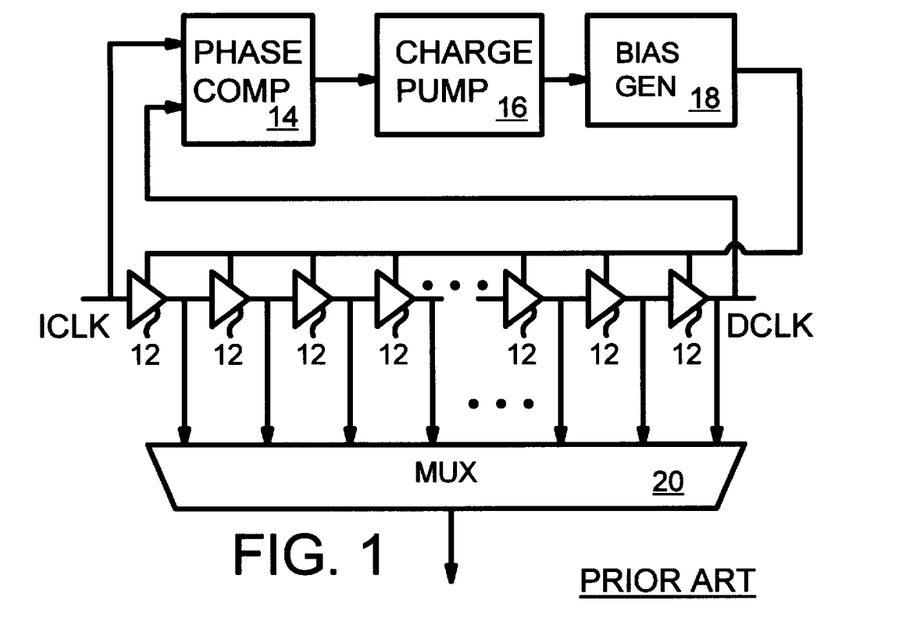
FIG. 1 is a diagram of a prior-art delay-locked loop (DLL).

FIG. 1 is a diagram of a prior-art delay-locked loop (DLL). An input clock ICLK is generated from a constant-frequency source such as from a crystal oscillator. A series of buffers 12 receive ICLK, and each successive buffer 12 delays ICLK by an additional buffer delay. The buffer delay is the same for all buffers 12, but the buffer delay may be adjusted by changing a bias voltage produces by bias generator 18. The bias voltage may be applied to a gate of a complementary metal-oxide-semiconductor (CMOS) transistor that acts as a current source or sink to alter the current through each buffer 12, and thus alter the delay to charge or discharge each buffer's output.

The output of the final buffer 12 in the series is the final delayed clock DCLK. DCLK is input to phase comparator 14 and compared to ICLK, the other input to phase comparator 14. Phase comparator 14 generates an output when the edge of ICLK does not occur simultaneously with the edge of DCLK. A positive or a negative output can be generated. Charge pump 16 responds to the output of phase comparator 14 by charging or discharging a filter capacitor (not shown). The voltage across the filter capacitor from charge pump 16 is input to bias generator 18. Bias generator 18 responds by generating the bias voltage from the input voltage and buffering its bias-voltage output to buffers 12.

When the phase of DCLK varies from that of ICLK, phase comparator 14 commands charge pump 16 to adjust the bias voltage to buffers 12. The delay through buffers 12 changes until the delay through the series of buffers 12 is exactly one period of ICLK.

When the phase of DCLK matches ICLK, the DLL becomes stable and the average bias voltage is no longer adjusted. Any variations in ICLK or DCLK are compensated for by altering the bias voltage until DCLK matches ICLK.

When all buffers 12 are identical, the ICLK period is exactly divided into N phases. Each buffer 12 outputs a clock that is delayed from ICLK. Mux 20 can be used to select one of these outputs as the generated clock. The phase of the generated clock can be any phase with the ICLK period divided by N. Selecting an output from one of the later buffers in the series increase the phase delay of the generated clock, while selecting an output from an earlier buffer in the series reduces the phase delay.

Sometimes a very precise clock is to be generated, requiring fine phase adjustments. For example, adjustments of only $\frac{1}{128}^{th}$ of the clock period are desired. The DLL requires 128 buffers (N=128) to divide the input clock ICLK into 128 phases. Mux 20 has 128 inputs so that any of the 128 phases can be selected as the generated clock.

Such precision requires a large number of buffers and a large mux. To prevent glitches, each of the buffer outputs may need to be latched. Thus 128 latches, buffers, and mux-inputs are required in this example. Such large numbers of components increases the area, cost, and power consumption of an integrated circuit (IC) containing such a precise DLL.

Figure 2:
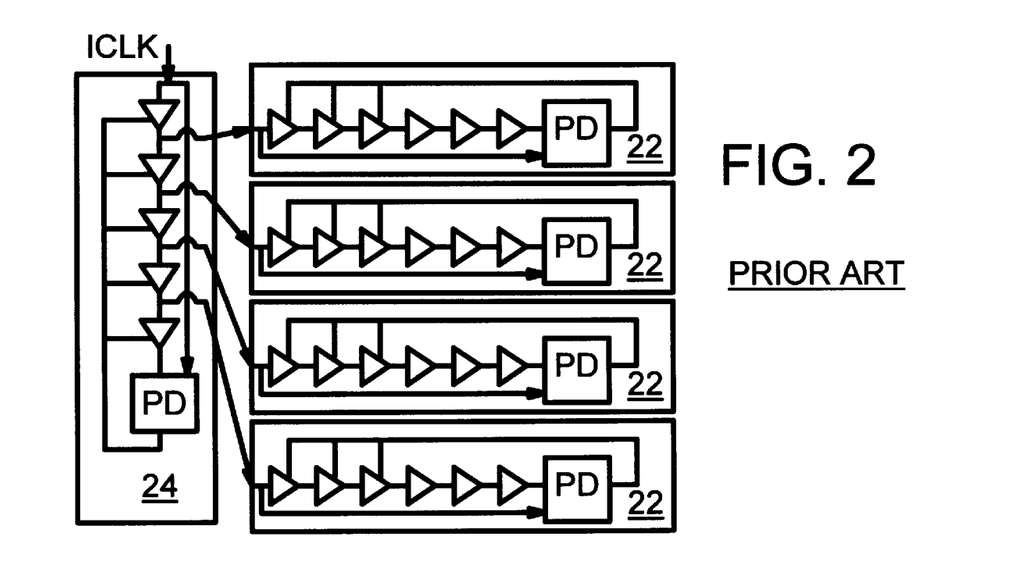
FIG. 2 shows a prior-art array of DLL's for generating precise clocks.

Array of DLLs—FIG. 2

An alternative for a high-precision DLL is presented by Christiansen in "An Integrated High Resolution CMOS Timing Generator Based on an Array of Delay Locked Loops", IEEE JSSCC, vol. 31, No. 7, July 1996. FIG. 2 shows a prior-art array of DLL's for generating precise clocks. A coarse DLL 24 receives the input clock ICLK and divides it into several sub-clocks. The phase detector (PD) includes not only phase comparator 14 of FIG. 1, but also charge pump 16 and bias generator 18. A single PD component is shown for simplicity.

Each of the sub-clocks from coarse DLL 24 is input to a fine DLL 22. Each of the fine DLLs 22 is a standard DLL with a series of buffers that generate a delayed clock that is compared to the input sub-clock by a phase detector PD. Thus each of the fine DLLs 22 divides the coarse-delayed sub-clock into multiple phases. In practice, fine DLLs 22 have many more buffer stages than coarse DLL 24. Coarse DLL 24 provides a relatively large initial phase shift, then fine DLLs 22 divide the sub-clocks into many smaller phases.

Note that all of the DLLs 22, 24 operate at the same frequency of the input clock ICLK. The fine DLLs 22 merely are phase-shifted relative to ICLK by coarse DLL 24. A large number of components is still required, since many fine DLLs 22 are required. For example, when coarse DLL 24 has four buffers, four fine DLLs 22 are required. Large multiplexers and latches are likely to be needed as well.

What is desired is a DLL for generating a high-precision clock. It is desired to adjust the phase of the generated clock in many increments of the input-clock period. Although many phases may be selected, it is desired to use fewer latches and components. It is desired to reduce the size of a DLL while still generating fine phase adjustments. Muxes with fewer inputs are desired for generating a precisely-adjusted clock. It is desired to eliminate the array of DLLs and instead use just two DLLs.

SUMMARY OF THE INVENTION

A segmented dual delay-locked-loop (DLL) has an input clock and a coarse delay-locked loop (DLL) that receives the input clock. It generates a plurality of intermediate clocks each having a different phase but having a same period as the input clock. The coarse DLL has a feedback loop for adjusting phase offsets of the intermediate clocks.

An intermediate mux receives the plurality of intermediate clocks. It outputs a K clock and a K+1 clock, where the K+1 clock has a phase immediately following a phase of the K clock. A fine delay-locked loop (DLL) receives the K clock and the K+1 clock from the intermediate mux. It generates a plurality of fine clocks each having a different phase between the phase of the K clock and the phase of the K+1 clock, where the plurality of fine clocks all have the same period as the input clock.

An output mux receives the plurality of fine clocks from the fine DLL. It outputs a generated clock. Thus the intermediate mux selects a coarse phase from the plurality of clocks generated by the coarse DLL, while the output mux selects a fine phase between phases of two adjacent intermediate clocks from the intermediate mux.

In further aspects of the invention the plurality of intermediate clocks has M intermediate clocks with M phase offsets equally spaced within one period of the input clock. The plurality of fine clocks has N fine clocks with N phase offsets equally spaced within a coarse interval between two adjacent intermediate clocks. The coarse interval is 1/M of the period of the input clock. The generated clock has a phase that is selected from M*N phases equally spaced within one period of the input clock. Thus M*N phases are generated from the coarse DLL and the fine DLL.

In further aspects the coarse DLL further has a series of buffers. A first buffer in the series of buffers receives the input clock. Successive buffers in the series of buffers output intermediate clocks in the plurality of intermediate clocks with successively larger phase offsets from the input clock. A phase detector receives the input clock and receives a final clock from a last buffer in the series of buffers. It detects a phase difference.

A bias generator is coupled to the phase detector. It adjusts a bias voltage in response to the phase difference detected by the phase detector. The buffers in the series of buffers are voltage-controlled buffers where a delay through a buffer is adjusted when the bias voltage is adjusted. The coarse DLL includes feedback that adjusts a total delay through the series of buffers to match a period of the input clock.

In still further aspects the coarse DLL further has a filter capacitor for generating a control voltage to the bias generator and a charge pump coupled to the phase detector. It charges or discharges the filter capacitor in response to the phase difference detected by the phase detector.

In other aspects the fine DLL further has a series of buffers. A first buffer in the series of buffers receives the K clock from the intermediate mux, where successive buffers in the series of buffers output fine clocks in the plurality of fine clocks with successively larger phase offsets from the K clock. A phase detector receives the K+1 clock from the intermediate mux and receives a final clock from a last buffer in the series of buffers It detects a phase difference. A bias generator is coupled to the phase detector. It adjusts a bias voltage in response to the phase difference detected by the phase detector. The buffers in the series of buffers are voltage-controlled buffers where a delay through a buffer is adjusted when the bias voltage is adjusted. The fine DLL includes feedback that adjusts a total delay through the series of buffers to match an interval between the K clock and the K+1 clock, the interval being a fraction of the period of the input clock.

In still further aspects of the invention the intermediate mux receives an upper address. The upper address has a value K indicating which of the plurality of intermediate clocks has a desired coarse phase. The output mux receives a lower address. The lower address has a value indicating which of the plurality of fine clocks has a desired fine phase. Thus the upper address determines the coarse phase of the generated clock while the lower address selects the fine phase of the generated clock.

DETAILED DESCRIPTION

The present invention relates to an improvement in delay-locked loops. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Only One Fine DLL Used

The inventor has realized that a segmented architecture rather than an array architecture is ideal for a precision clock-generator using a delay-locked loop (DLL). Rather than use many DLL's, only two DLLs are used for the segmented DLL. A coarse DLL divides the input clock into several coarse phases. Then a fine DLL further divides an interval between two coarse phases into many fine phases. Only a single fine DLL is used.

An intermediate multiplexer selects one of the coarse phases for input to the fine DLL. However, the coarse phase immediately following the selected phase is also selected by the intermediate mux. Both the selected coarse phase and the following coarse phase are input to the fine DLL.

The fine DLL sends the selected coarse phase through its series of delay buffers, and compares the delayed output to the following coarse phase. The fine DLL adjusts its buffer delays to match the time interval between the selected coarse phase and the following coarse phase. Thus one of the coarse intervals is sub-divided by the fine DLL into many smaller fine intervals.

Fine DLL Locks to Coarse Interval, Not Whole Period

The fine DLL locks to the interval between two of the coarse phases. In contrast, the prior-art array DLL locks to the period of the input clock ICLK. Since the interval between two adjacent coarse phases is much smaller than the ICLK period, finer phase intervals are generated with fewer components.

For example, 128 phase divisions of the input clock can be generated by a 16-buffer coarse DLL and just one 8-buffer fine DLL. One of the 16 coarse intervals is selected by the intermediate mux and input to the fine DLL, which further divides the coarse interval into 8 fine intervals. The size of the fine interval is $\frac{1}{8}^{th}$ the size of the coarse interval. Since the coarse interval is $\frac{1}{16}^{th}$ of the ICLK period, the fine interval is $\frac{1}{128}^{th}$ of the ICLK period.

A clock is generated with 128 phase intervals using just a 16-buffer coarse DLL and an 8-buffer fine DLL, along with the intermediate mux. The intermediate mux is two parallel 16-input muxes, while an 8-input output mux selects the final generated clock from the 8 fine-DLL phases. Thus a 128-input mux is reduced to 3 muxes with a total of 40 inputs. This is about a $\frac{2}{3}^{rds}$ reduction in components. Rather than use 128 buffer stages in the big DLL of FIG. 1, only 16+8 or 24 total buffer stages are needed. This is an 80% reduction in buffers.

Figure 3:
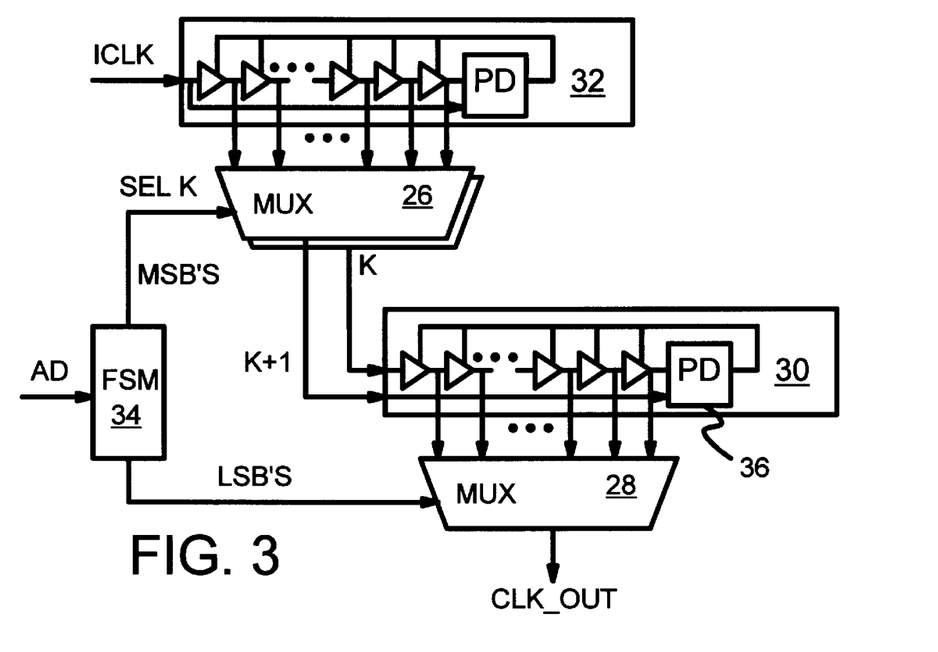
FIG. 3 is a diagram of a segmented DLL using just 2 DLL loops.

Segmented DLL—FIG. 3

FIG. 3 is a diagram of a segmented DLL using just 2 DLL loops. A coarse DLL 32 receives the input clock ICLK and divides it into M equal time-intervals, producing M intermediate clocks each with a different phase but the same period as ICLK. The phases of the intermediate clocks are staggered from one another by the period of ICLK divided by M.

Coarse DLL 32 is a standard DLL that adjusts a bias voltage to each of the M buffers to adjust the total delay through the buffers to match the period of the input clock ICLK. The phase detector (PD) in DLLs 30, 32 includes not only phase comparator 14 of FIG. 1, but also charge pump 16 and bias generator 18. A single PD component is shown for simplicity.

Intermediate mux 26 selects one of the M intermediate clocks generated by the M buffers in coarse DLL 32. Intermediate mux 26 also contains a shadow mux that selects the following intermediate clock generated by the following buffer in the series of buffers in coarse DLL 32.

Intermediate mux 26 receives an address from finite-state machine FSM 34 that indicates which of the M intermediate clocks to select. The upper or most-significant-bits (MSBs) of an input address AD are used to select the coarse phase. The selected intermediate clock K and the following intermediate clock K+1 are selected by intermediate mux 26. When the selected intermediate clock K is from the last buffer, then the following intermediate clock K+1 is the first intermediate clock.

Thus both the selected intermediate clock K and the following intermediate clock K+1 are sent from intermediate mux 26 to fine DLL 30. Fine DLL 30 is a slightly-modified DLL. Rather than connect the standard DLL's one input to both the series of buffers and the phase detector, two separate inputs to the modified DLL are used. One input (K) drives the series of buffers while the other input (K+1) is sent directly to the phase detector. Fine DLL 30 adjusts the delay of intermediate clock K through the series of buffers to match the phase of the K+1 intermediate clock that bypasses the series of buffers. Since the K+1 intermediate clock is delayed in phase by one coarse-DLL interval from the K intermediate clock, the delay through the buffers is adjusted to equal one coarse-DLL period.

The least-significant-bits (LSBs) of the address AD is sent by FSM 34 to output mux 28. Output mux 28 selects one of the N outputs from the N buffers in fine DLL 30 as the generated clock output, CLK_OUT. The MSBs of the address AD select the coarse phase (the intermediate clock from coarse DLL 32), while the LSBs of address AD select the fine phase (the output clock from fine DLL 30).

In the preferred embodiment, the coarse DLL has M=16 buffers while the fine DLL has N=8 buffers. A total of 16+8 or 24 buffers are able to generate any one of 128 phases of input clock ICLK. Only 2 16-input muxes and one 8-input mux are needed. The muxes preferably have buffers on all inputs to eliminate loading variations on the DLL buffers. Loading variations occur for some kinds of muxes when the mux switches, altering the input loads. This is especially true of muxes using CMOS transmission gates rather than standard logic gates.

FSM 34 is used to precisely control when the address inputs to muxes 26, 28 may change. This prevents glitching of the generated or intermediate clocks. The delay through intermediate mux 26 for intermediate clocks K and K+1 must match for precise clock generation.

Figure 4:
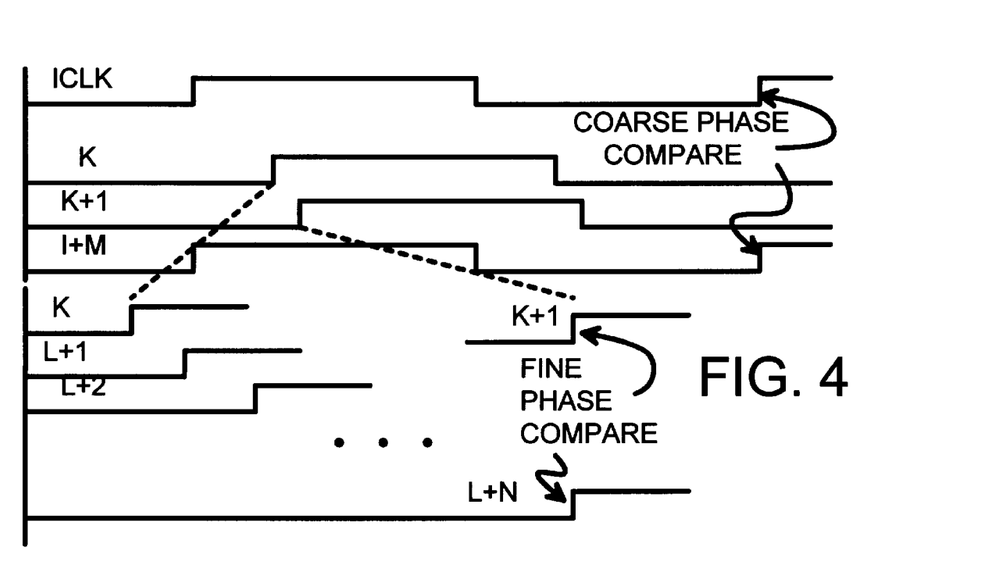
FIG. 4 is a waveform illustrating operation of the segmented DLL.

Timing Waveform—FIG. 4

FIG. 4 is a waveform illustrating operation of the segmented DLL. An input clock ICLK is divided into a series of M intermediate clocks, (I+1, I+2, I+3, . . . I+M) each being staggered in phase by the ICLK period divided by M. The final buffer in the series generates the final intermediate clock I+M. The coarse DLL phase-and-frequency compares the input clock ICLK to the final intermediate clock I+M and adjusts the delay through the buffers until clock I+M matches ICLK.

A selected intermediate clock K is shown, and the following intermediate clock K+1. Clocks K and K+1 differ in phase by the ICLK period divided by M. The selected intermediate clock K and the following intermediate clock K+1 are selected by the intermediate mux, and both are input to the fine DLL.

The interval between clocks K and K+1 is shown as expanded at the bottom of FIG. 4. The series of buffers in the fine DLL generates from intermediate clock K a series of fine clocks L+1, L+2, . . . L+N with increasing phase delays. The final clock in the series of N buffers, L+N, is input to the phase comparator in the fine DLL. The phase of this last clock L+N is compared to the following intermediate clock K+1. The feedback loop of the fine DLL adjusts the bias voltage to the series of buffers in the fine DLL until the total delay through the N buffers matches the time interval from intermediate clock K to intermediate clock K+1.

Thus the coarse DLL performs a coarse phase compare to adjust the total delay to the ICLK period, while the fine DLL performs a fine phase compare to adjust the total delay through the fine DLL to the interval between adjacent intermediate clocks from the coarse DLL. The fine DLL has a much smaller total delay than the coarse DLL.

Figure 5:
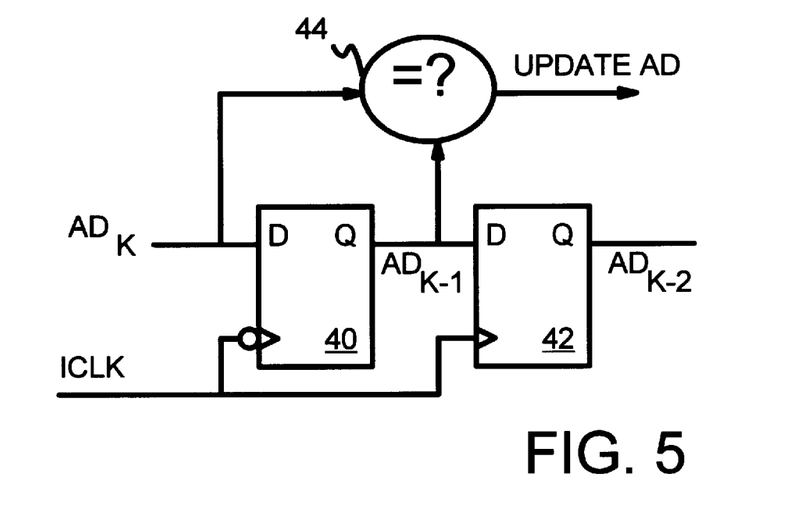
FIG. 5 shows registers in the finite state machine (FSM) for detecting and synchronizing phase-select-address changes when the selected phase is to change.
Figure 6A:
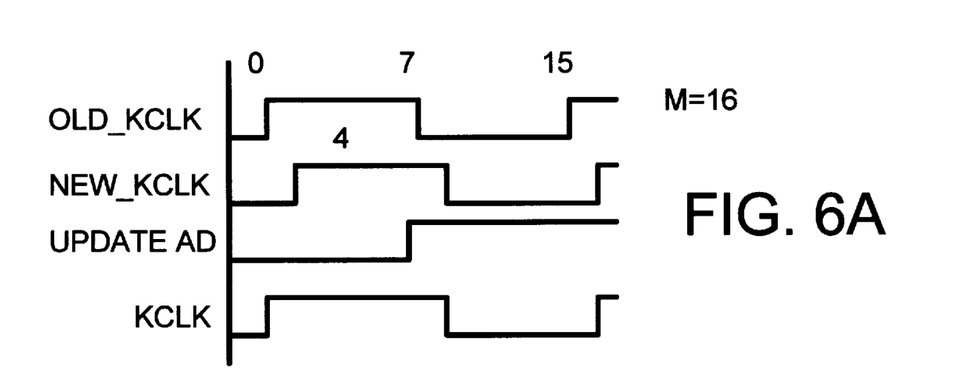
FIG. 6A is a waveform showing the intermediate clock changing on the falling edge when the new address is 0 to 7 coarse phases ahead of the current intermediate clock.
Figure 6B:
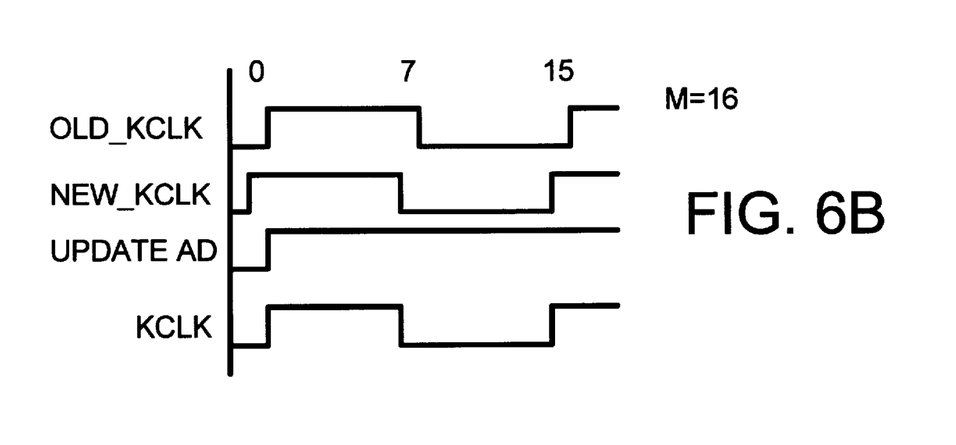
FIG. 6B is a waveform showing the intermediate clock changing on the rising edge when the new address is 8 to 15 phases ahead of the current intermediate clock.

Finite State Machine to Eliminate Glitches—FIGS. 5, 6

The finite state machine (FSM) eliminates glitches when the selected phase changes. The address of the desired phase may be altered or adjusted by clock-recovery or sensing circuitry. The phase-selecting address AD preferably represents a binary-encoded number indicating which of the 128 phase-delayed clocks to generate. A 7-bit address AD is sufficient to select one of the 128 possible phases for the generated clock.

The 7-bit address AD is split into 4 MSBs and 3 LSBs. The 4 MSBs select one of the 16 intermediate clocks generated by the coarse DLL using the intermediate mux, while the 3 LSBs select one of the eight phases from the fine DLL, which are selected by the output mux.

When the address changes, and the intermediate or output mux changes which phase is selected, the generated clock can glitch. To prevent such glitches, the intermediate mux may only change at precise times relative to the current intermediate clock. Registers in the FSM are used to latch the address AD and send the changed address to the intermediate mux only with enough setup and hold times to the clock edges of the current intermediate clock.

Since the intermediate mux makes larger adjustments in phase, while the output mux makes only minor phase adjustments, only the MSBs to the intermediate mux need to be synchronized by the FSM. The LSBs that control the output mux are also synchronized by the FSM.

FIG. 5 shows registers in the finite state machine (FSM) for detecting and synchronizing phase-select-address changes when the selected phase is to change. The upper 4-bit MSB of address $AD_K$ is input to register 40 and latched on the falling edge of ICLK. On the next rising edge of ICLK, the delayed address $AD_{K-1}$ is latched into register 42. The addresses stored in registers 40, 42 are compared by comparator 44, and when they differ the address has changed.

The old address is compared to the new address to determine the phase difference among the two addresses. When the new address is 0 to 7 of the 16 phase intervals ahead of the current K clock, the new address is applied to the intermediate mux just before the next falling edge K clock. Otherwise, when the new address is 8 to 15 of the 16 phase intervals ahead of the current K clock, the new address is applied to the intermediate mux just after the next rising edge K clock.

Comparator 44 generates an UPDATE_AD signal to indicate when the address to the intermediate mux should change. Additional register stages (not shown) are added after comparator 44 to re-synchronize the MSB address bits from register 42 to K clock, and to apply the new address to the intermediate mux on either the rising or falling edge of the old intermediate clock K.

FIG. 6A is a waveform showing the intermediate clock changing on the falling edge when the new address is 0 to 7 coarse phases ahead of the current intermediate clock. The current or old K intermediate clock is divided into 16 intervals, with intervals 0 to 7 occurring when K clock is high and intervals 8 to 15 occurring when K clock is low. When the new address is 0 to 7 intervals ahead of the current K clock, the UPDATE_AD signal updates the address to the intermediate mux before the falling edge of the current K clock. The resulting clock output by the intermediate mux switches to the new K clock before the old K clock transitions low. Thus an extended high pulse is generated.

FIG. 6B is a waveform showing the intermediate clock changing on the rising edge when the new address is 8 to 15 phases ahead of the current intermediate clock. When the new address is 8 to 15 intervals ahead of the current K clock, the UPDATE_AD signal updates the address to the intermediate mux after the rising edge of the current K clock. The resulting clock output by the intermediate mux switches to the new K clock after the old K clock transitions low. Thus a shortened high pulse is generated.

Figure 7A:
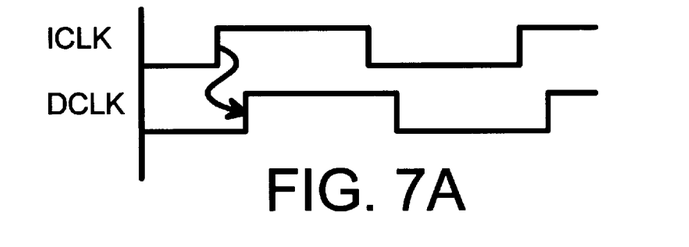
FIGS. 7A–C highlight how an improper state of operation can occur in a DLL.
Figure 7B:
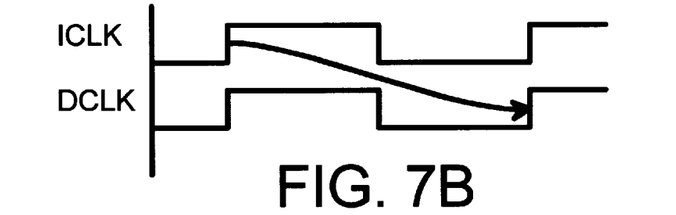
Figure 7C:
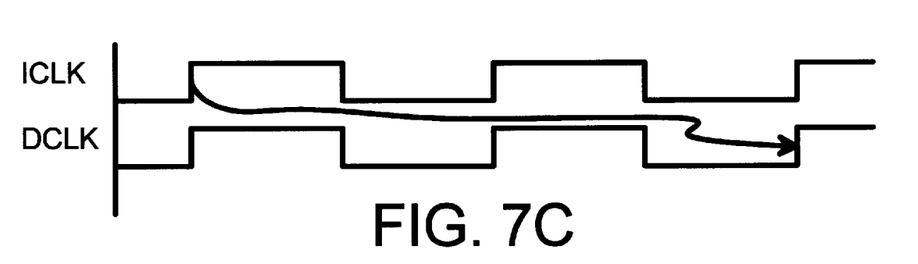

Improper Double-Delay DLL States—FIGS. 7A–C

FIGS. 7A–C highlight how an improper state of operation can occur in a DLL. In FIG. 7A, a DLL detects a phase difference between the input clock ICLK and the final delayed clock DCLK. The DLL adjusts by increasing the delays through the buffer until the total delay through all the buffers is equal to the period of ICLK so that the rising edges of ICLK and DCLK are simultaneous, as shown in FIG. 7B.

Over process and temperature excursions, the DLL may settle into an improper state. The DLL may continue to increase the buffer delays past the one-period alignment. Once the total buffer delay equals two ICLK periods, phase alignment again occurs. FIG. 7C shows phase alignment when the total delay through the DLL buffers equals two periods rather than just one.

Although the clock periods of ICLK and DCLK are the same, the phase intervals are twice as large in the abnormal operation of FIG. 7C compared with the normal operation of FIG. 7B. For a 16-buffer DLL, normally each successive clock has an additional phase delay of one ICLK period divided by 16. However, for the abnormal operation of FIG. 7C, the total delay is two ICLK periods is divided into 16 intervals. Thus each successive clock has an additional phase delay of two ICLK periods divided by 16, or double the normal phase difference.

The DLL may also lock to three or more ICLK periods, depending on the bias voltage range and the ICLK clock period. The generated clock does not have the expected phase adjustments since the phase is adjusted by two or more times the expected phase interval.

Figure 8:
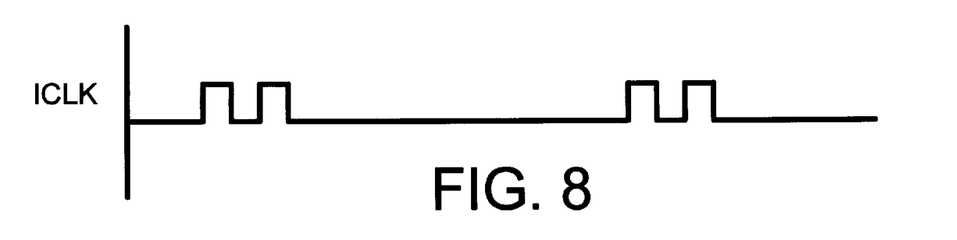
FIG. 8 shows a dual-pulse stimulus applied to the DLL during initialization to prevent double-delay operation.

DLL Training Pulses—FIG. 8

The inventor has realized that this problem can exist especially in high-speed circuits. The inventor solves this double-delay problem by using special training pulses to initialize the DLL.

FIG. 8 shows a dual-pulse stimulus applied to the DLL during initialization to prevent double-delay operation. The input clock ICLK is modified during initialization or at other times to reset the DLL. Rather than a continuous stream of pulses, a pair of pulses at the desired frequency are applied, followed by a constant signal without pulses for the next 7 ICLK periods. The pair of pulses and 7-period blanking then repeats.

The rising edge of the first pulse arms the DLL's phase detector and propagates through the series of delay buffers, allowing phase comparison to occur for the second pulse. Since there are no pulses after the second pulse for 7 periods, the DLL cannot lock to any other pulses except the second pulse. The DLL can only phase compare during the second pulse, when the first-pulse has propagated through the buffers to the phase detector. Thus the total delay through the buffers can only equal one ICLK period. Multiple-period delays are not possible.

The 7-period blanking is used because it is sufficiently long to prevent false operation. The total delay through the buffers can never reach seven ICLK periods, as the bias voltage has a limited range for adjustment.

The DLL is modified so that phase comparison can only occur when the phase detector is armed by the first pulse. Thus the bias voltage is locked and cannot change for the 7 periods lacking a pulse. After several of the 9-period training cycles, the DLL becomes stable at a total delay of one ICLK period with the bias voltage properly set. Then the continuously-pulsing ICLK can be applied for normal operation. The training sequence can be reapplied to reset the DLL when an error threshold or frequency is reached or after a pre-determined period, such as once every hour.

Figure 9A:
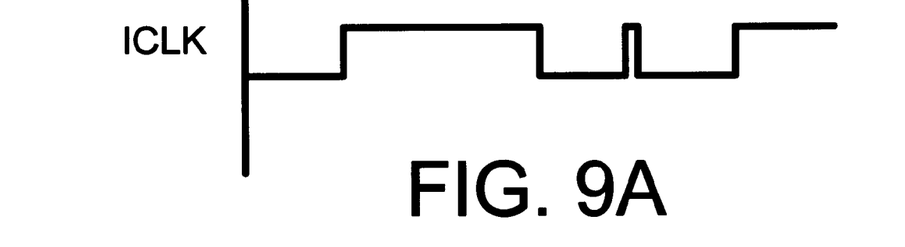
FIGS. 9A–C highlight arming the phase detectors in the DLLs for glitch filtering.
Figure 9B:
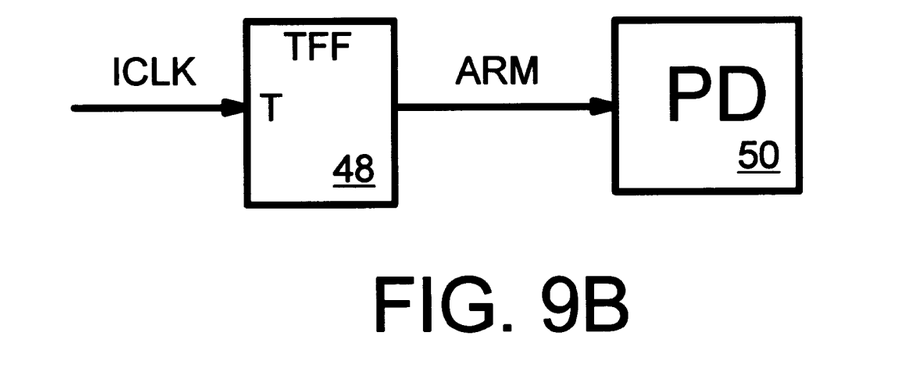
Figure 9C:
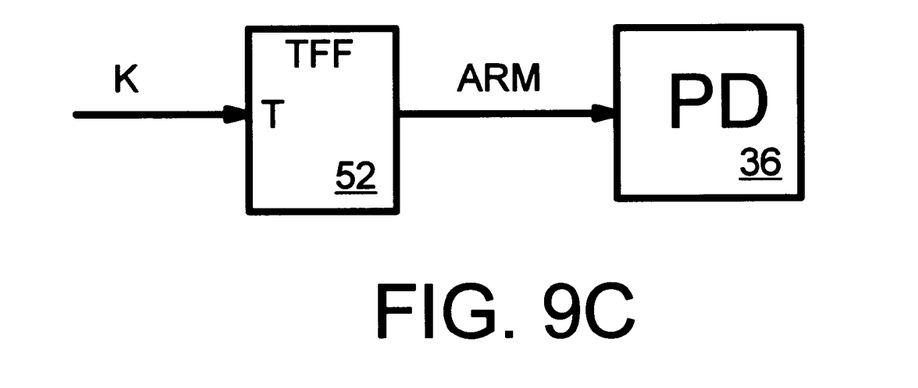

Arming Phase Detector—FIGS. 9A–C

FIGS. 9A–C highlight arming the phase detectors in the DLLs for robustness against glitches. In FIG. 9A, a glitch occurs in the input clock ICLK. This glitch can trigger the phase detector, causing a false phase comparison to occur. The charge pump can then charge or discharge the filter capacitor, resulting in an unwanted adjustment to the bias voltage. The series of buffers may filter out the glitch so it is not seen by the other input of the phase detector. Thus an extra pulse is seen by the phase detector.

FIG. 9B shows an arming circuit for the phase detector in the coarse DLL. The input clock ICLK is applied to the input of toggle flip-flop 48. Toggle flip-flop 48 toggles its output on each falling edge of ICLK, thus dividing ICLK by two. Phase comparison occurs on the rising edge of ICLK when armed.

The output of toggle flip-flop 48 is applied to an arming input of phase detector 50. The arming input prevents phase comparison when low but allows phase detection when high. Also, a low on the arming input resets the phase detector. The reset allows the phase detector to recover from an illegal or unexpected state such as a double-delay state.

Using toggle flip-flop 48 to arm phase detector 50 every other ICLK period prevents the DLL from entering or drifting into the double-delay state when a glitch occurs. Furthermore, resetting phase detector 50 every other ICLK period prevents phase-detector errors.

FIG. 9C shows an arming circuit for the phase detector in the fine DLL. The intermediate clock K is applied to the input of toggle flip-flop 52. Toggle flip-flop 52 toggles its output on each falling edge of intermediate clock K, thus dividing clock K by two. Phase comparison occurs on the rising edge of clock K when phase detector 36 is armed.

The output of toggle flip-flop 52 is applied to an arming input of phase detector 36 in the fine DLL. The arming input prevents phase comparison when low but allows phase detection when high. The low on the arming input also resets the phase detector.

Figure 10:
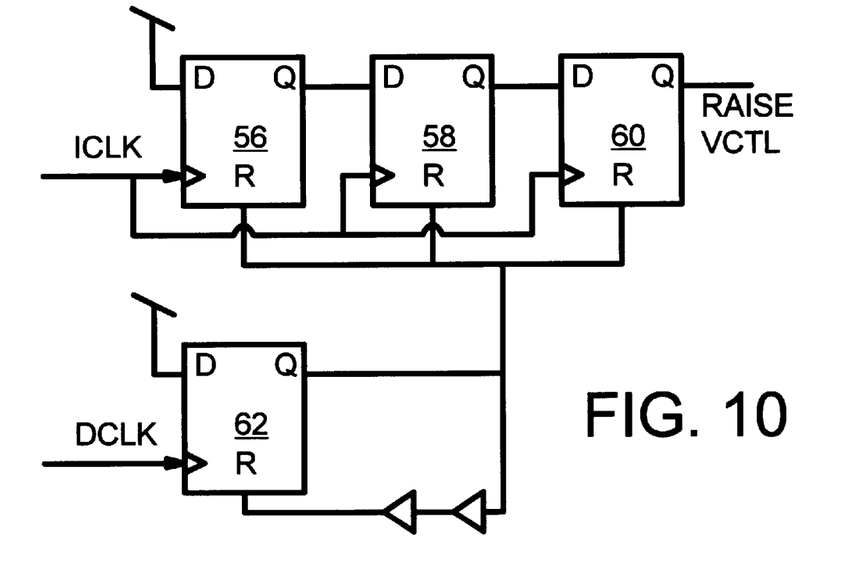
FIG. 10 shows a startup circuit that raises the bias voltage when no phase comparisons occur.

Startup Circuit Raises Bias Voltage—FIG. 10

The delay buffers in the DLL have a delay that varies as the bias voltage is changed. These delay buffers typically are analog circuits or amplifiers that use relatively small voltage levels. During circuit startup as the power-supply is ramped up, the bias voltage may be very low. The low bias voltage at startup may not be high enough to allow the delay buffers to pass signals through. Thus the input clock may not be propagated through the series of buffers to the phase detector. The DLL thus may not operate properly at startup. Further, the DLL may remain in a non-operating state once full power is reached, since the bias voltage may be stuck too low.

FIG. 10 shows a startup circuit that raises the bias voltage when no phase comparisons occur. This circuit detects when no clock through the delay buffers for three ICLK periods. The circuit then signals the bias-voltage generator to raise the bias voltage. Thus the bias voltage can be raised at startup in the absence of phase comparisons.

Flip-flops 56, 58, 60 clock a high signal through on each rising edge of ICLK, until flip-flop 60 outputs a one after the third ICLK. Flip-flop 60 generates a signal applied to the charge pump or the bias-voltage generator that causes the bias voltage to be raised. However, when DCLK is pulsed, flip-flop 62 outputs a high signal that clears flip-flops 56, 58, 60, and after a delay clears flip-flop 62. Thus flip-flop 60 is prevented from signaling that the bias voltage be raised when the delay buffers are able to propagate ICLK and pulse DCLK.

Rather than use DCLK at the end of the series of buffers, one of the intermediate clocks can be used. The clock generated by the first voltage-controlled buffer in the series may also be used instead of DCLK.

Figure 11:
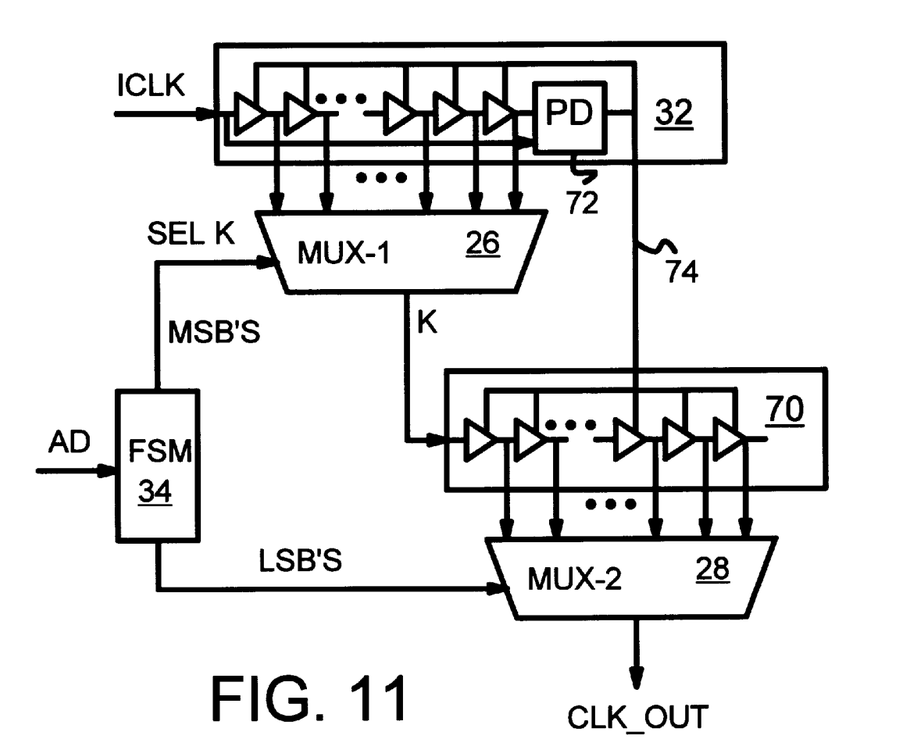
FIG. 11 is an alternate embodiment where the bias voltage from the coarse DLL is used to adjust delays in the fine delay loop.

Shared Bias Voltage for Both DLLs—FIG. 11

FIG. 11 is an alternate embodiment where the bias voltage from the coarse DLL is used to adjust delays in the fine delay loop. FIG. 11 operates in much the same was as described for FIG. 3. However, the fine DLL is modified. Rather than use a full DLL with a phase detector, charge pump, and bias generator, only a series of buffers is used.

Fine delay chain 70 is a series of buffers without a phase detector or a feedback loop. The delay through the buffers in fine delay chain 70 is variable, depending on a bias voltage. However, rather than use the bias voltage generated within the fine DLL, bias voltage 74 generated by coarse DLL 32 is used. Phase detector 72 in coarse DLL 32 generates bias voltage 74 that sets the delays in both coarse DLL 32 and fine delay chain 70.

Thus bias voltage 74 from coarse DLL 32 sets the buffer delays for both coarse DLL 32 and fine delay chain 70. When the accuracy requirement is not as stringent, the feedback in the fine DLL can be eliminated. The delay still tracks with temperature and process variations, since phase detector 72 adjusts for temperature and process variations.

The total delay through fine delay chain 70 must be carefully chosen so that the total delay matches the coarse interval. Since there is no feedback to adjust the delay through fine delay chain 70 to match the coarse interval between intermediate clocks K and K+1, the total delay must be simulated. Since the K+1 intermediate clock is no longer needed, intermediate mux 26 only outputs clock K output mux 28 still selects one of the buffer outputs from fine delay chain 70 as the output clock.

ADVANTAGES OF THE INVENTION

A DLL generates a high-precision clock. The phase of the generated clock is adjusted in many increments of the input-clock period. Although many phases may be selected, fewer latches and components are needed. The size of the DLL is reduced while still generating fine phase adjustments. Muxes with fewer inputs are used for generating a precisely-adjusted clock. The array of DLLs is eliminated. Instead just two DLLs are used.

A clock may be generated with 128 phase intervals using just a 16-buffer coarse DLL and an 8-buffer fine DLL, along with the intermediate mux and output mux. The intermediate mux is two parallel 16-input muxes, while the 8-input output mux selects the final generated clock from the 8 fine-DLL phases. Thus a 128-input mux is reduced to 3 muxes with a total of 40 inputs. This is about a $\frac{2}{3}^{rds}$ reduction in components. Rather than use 128 buffer stages in the big DLL of FIG. 1, only 16+8 or 24 total buffer stages are needed. This is an 80% reduction in buffers. Two DLLs are used, rather than the 5 or more DLLs in the prior-art array-DLL of FIG. 2.

ALTERNATE EMBODIMENTS

Several other embodiments are contemplated by the inventor. For example other fine or coarse DLL loops could be added in a parallel or interleaved arrangement. Inverters rather than non-inverting buffer stages could be used, or more complex amplifiers or R-C delay stages with voltage-controlled delays could be employed. Additional buffers before or after the delay series can be added and the input clock or inputs to the phase detector or muxes can be buffered. Differential buffers may be used. Muxes can be made out of the same analog differential delay stage circuits in order to avoid having to level-translate the clock signals to CMOS voltage levels and then back down to the smaller voltage levels.

While the preferred embodiment has been described with 128 intervals using a 16-buffer coarse DLL and an 8-buffer fine DLL, other combinations of coarse and fine DLLs may be used for 128-interval clock generation, or for other granularities such as 64, 256, etc. Rather than have just two levels of DLL—coarse and fine—it is also possible to extend the invention by having a third-level, super-fine DLL to produce even finer intervals, such as 512 or 1024.

Other circuits can be used as the finite state machine to synchronize the address changes. Likewise other circuits can be used for arming the phase detectors or for slewing the bias voltage at startup. Many implementations of delay buffers and muxes are possible, using a variety of technologies.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A segmented dual delay-locked-loop (DLL) comprising:
   an input clock;
   a coarse delay-locked loop (DLL), receiving the input clock, for generating a plurality of intermediate clocks each having a different phase but having a same period as the input clock, the coarse DLL having a feedback loop for adjusting phase offsets of the intermediate clocks;
   an intermediate mux, receiving the plurality of intermediate clocks, for outputting a K clock and a K+1 clock, wherein the K+1 clock has a phase immediately following a phase of the K clock;
   a fine delay-locked loop (DLL), receiving the K clock and the K+1 clock from the intermediate mux, for generating a plurality of fine clocks each having a different phase between the phase of the K clock and the phase of the K+1 clock, wherein the plurality of fine clocks all have the same period as the input clock; and
   an output mux, receiving the plurality of fine clocks from the fine DLL, for outputting a generated clock
   whereby the intermediate mux selects a coarse phase from the plurality of clocks generated by the coarse DLL, while the output mux selects a fine phase between phases of two adjacent intermediate clocks from the intermediate mux.

2. The segmented dual DLL of claim 1 wherein the plurality of intermediate clocks comprises M intermediate clocks having M phase offsets equally spaced within one period of the input clock;
   wherein the plurality of fine clocks comprises N fine clocks having N phase offsets equally spaced within a coarse interval between two adjacent intermediate clocks, the coarse interval being 1/M of the period of the input clock;
   wherein the generated clock has a phase that is selected from M*N phases equally spaced within one period of the input clock,
   whereby M*N phases are generated from the coarse DLL and the fine DLL.

3. The segmented dual DLL of claim 1 wherein the coarse DLL further comprises:
   a series of buffers, a first buffer in the series of buffers receiving the input clock, wherein successive buffers in the series of buffers output intermediate clocks in the plurality of intermediate clocks with successively larger phase offsets from the input clock;
   a phase detector, receiving the input clock and receiving a final clock from a last buffer in the series of buffers, for detecting a phase difference; and
   a bias generator, coupled to the phase detector, for adjusting a bias voltage in response to the phase difference detected by the phase detector;
   wherein the buffers in the series of buffers are voltage-controlled buffers wherein a delay through a buffer is adjusted when the bias voltage is adjusted,
   wherein the coarse DLL includes feedback that adjusts a total delay through the series of buffers to match a period of the input clock.

4. The segmented dual DLL of claim 3 wherein the coarse DLL further comprises:
   a filter capacitor for generating a control voltage to the bias generator;
   charge pump, coupled to the phase detector, for charging or discharging the filter capacitor in response to the phase difference detected by the phase detector.

5. The segmented dual DLL of claim 4 wherein the fine DLL further comprises:
   a series of buffers, a first buffer in the series of buffers receiving the K clock from the intermediate mux, wherein successive buffers in the series of buffers output fine clocks in the plurality of fine clocks with successively larger phase offsets from the K clock;
   a phase detector, receiving the K+1 clock from the intermediate mux and receiving a final clock from a last buffer in the series of buffers, for detecting a phase difference; and
   a bias generator, coupled to the phase detector, for adjusting a bias voltage in response to the phase difference detected by the phase detector;
   wherein the buffers in the series of buffers are voltage-controlled buffers wherein a delay through a buffer is adjusted when the bias voltage is adjusted,
   wherein the fine DLL includes feedback that adjusts a total delay through the series of buffers to match an interval between the K clock and the K+1 clock, the interval being a fraction of the period of the input clock.

6. The segmented dual DLL of claim 5 wherein the intermediate mux receives an upper address, the upper address having a value K indicating which of the plurality of intermediate clocks has a desired coarse phase;
   wherein the output mux receives a lower address, the lower address having a value indicating which of the plurality of fine clocks has a desired fine phase;
   whereby the upper address determines the coarse phase of the generated clock while the lower address selects the fine phase of the generated clock.

7. The segmented dual DLL of claim 6 further comprising:
   a synchronizer, receiving a phase-selecting address indicating a desired phase of the generated clock, for synchronizing at least a portion of the phase-selecting address to the K clock, whereby the phase-selecting address is synchronized to one of the intermediate clocks.

8. The segmented dual DLL of claim 5 wherein the coarse DLL further comprises:

arming means, coupled to the phase detector, for periodically resetting the phase detector, wherein the phase detector is disabled from phase comparing for some periods of the input clock;

wherein the phase detector is prevented from entering a double-delay state wherein the total delay through the series of buffers is double the period of the input clock.

9. A variable-phase clock generator comprising:

an input clock having an input-clock period;

a coarse-phase clock generator, receiving the input clock, the coarse-phase clock generator having a series of delay buffers, a phase detector, and a feedback, the feedback adjusting a total delay through the series of delay buffers to match the input-clock period in response to a phase difference detected by the phase detector;

wherein the phase detector receives an input from the series of delay buffers within the coarse-phase clock generator, wherein the phase detector does not receive an input from the fine-phase clock generator, the phase detector matching a coarse delay but not matching a fine delay;

wherein a plurality of intermediate clocks are output by the series of delay buffers in the coarse-phase clock generator, the plurality of intermediate clocks being offset in phase from each other;

an intermediate selector, receiving the plurality of intermediate clocks, for selecting a selected intermediate clock from the plurality of intermediate clocks in response to a coarse phase-selector address;

a fine-phase clock generator, receiving the selected intermediate clock from the intermediate selector, for generating a plurality of fine clocks, the plurality of fine clocks being offset in phase from each other by a smaller offset than the offset for the intermediate clocks; and an output selector, receiving the plurality of fine clocks, for selecting a selected fine clock from the plurality of fine clocks in response to a fine phase-selector address, whereby the selected fine clock has a phase offset between two adjacent intermediate clocks.

10. The variable-phase clock generator of claim 9 wherein the fine-phase clock generator comprises a fine series of delay buffers, a first delay buffer in the fine series receiving the selected intermediate clock from the intermediate selector, wherein successive delay buffers in the fine series output fine clocks with successively larger phase offsets, wherein the fine series of buffers generates the fine clocks.

11. The variable-phase clock generator of claim 10 wherein the fine series of buffers in the fine-phase clock generator receives the feedback generated by the phase detector in the coarse-phase clock generator, the phase detector adjusting delays for delay buffers in both the coarse-phase clock generator and the fine-phase clock generator, whereby a same feedback adjusts delays in both fine and coarse clock generators.

12. The variable-phase clock generator of claim 11 wherein the feedback comprises a bias voltage, the bias voltage generated in response to a phase difference detected in the coarse-phase clock generator adjusting delays in both clock generators;

wherein the delay buffers are voltage-controlled delay buffers.

13. The variable-phase clock generator of claim 12 further comprising:

voltage slew means, activated by powering up the variable-phase clock generator, for slewing the bias voltage when the bias voltage is insufficient to enable the delay buffers to propagate signals.

14. The variable-phase clock generator of claim 10 wherein the fine-phase clock generator further comprises:

a fine phase detector, receiving a last fine clock from the fine series of delay buffers and receiving a second intermediate clock from the intermediate selector, the second intermediate clock having an adjacent phase offset to the selected intermediate clock, the fine phase detector adjusting a total delay through the fine series of delay buffers to match an interval between the selected intermediate clock and the second intermediate clock, wherein the intermediate selector also selects the second intermediate clock, whereby the fine-phase clock generator is a DLL having two inputs being adjacent intermediate clocks.

15. The variable-phase clock generator of claim 10 wherein each delay buffer in the fine series has a smaller delay than a delay through each of the delay buffers in the series of delay buffers in the coarse-phase clock generator, whereby smaller delay intervals are generated by the fine series than for the series in the coarse-phase clock generator.

16. The variable-phase clock generator of claim 10 further comprising:

a synchronizer state machine for generating the coarse phase-selector address, the synchronizer state machine having registers for synchronizing an input address to the selected intermediate clock.

17. A segmented dual delay-locked-loop (DLL) clock generator comprising:

an input clock;

coarse DLL means, receiving the input clock, for generating a plurality of intermediate clocks each having a different phase but having a same period as the input clock, the coarse DLL means having feedback loop means for adjusting phase offsets of the intermediate clocks;

intermediate mux means, receiving the plurality of intermediate clocks, for outputting a K clock and a K+1 clock, wherein the K+1 clock has a phase immediately following a phase of the K clock;

a fine DLL means, receiving the K clock and the K+1 clock from the intermediate mux means, for generating a plurality of fine clocks each having a different phase between the phase of the K clock and the phase of the K+1 clock, wherein the plurality of fine clocks all have the same period as the input clock; and output mux means, receiving the plurality of fine clocks from the fine DLL means, for outputting a generated clock whereby the intermediate mux means selects a coarse phase from the plurality of clocks generated by the coarse DLL means, while the output mux means selects a fine phase between phases of two adjacent intermediate clocks from the intermediate mux means.

18. The segmented dual-DLL clock generator of claim 17 wherein the coarse DLL means further comprises:

series means for delaying the input clock, a first buffer in the series means receiving the input clock, wherein successive buffers in the series means output intermediate clocks in the plurality of intermediate clocks with successively larger phase offsets from the input clock;

phase detector means, receiving the input clock and receiving a final clock from a last buffer in the series means, for detecting a phase difference; and bias generator means, coupled to the phase detector means, for adjusting a bias voltage in response to the phase difference detected by the phase detector means;

wherein the buffers in the series means are voltage-controlled buffers wherein a delay through a buffer is adjusted when the bias voltage is adjusted, wherein the coarse DLL means includes feedback that adjusts a total delay through the series means to match a period of the input clock.

19. The segmented dual-DLL clock generator of claim 18 wherein the coarse DLL means further comprises:

filter capacitor means for generating a control voltage to the bias generator means;

charge pump means, coupled to the phase detector means, for charging or discharging the filter capacitor means in response to the phase difference detected by the phase detector means.

20. The segmented dual-DLL clock generator of claim 17 wherein the fine DLL means further comprises:

fine series means for delaying the K clock, a first buffer in the fine series means receiving the K clock from the intermediate mux means, wherein successive buffers in the fine series means output fine clocks in the plurality of fine clocks with successively larger phase offsets from the K clock;

phase detector means, receiving the K+1 clock from the intermediate mux means and receiving a final clock from a last buffer in the fine series means, for detecting a phase difference; and bias generator means, coupled to the phase detector means, for adjusting a bias voltage in response to the phase difference detected by the phase detector means;

wherein the buffers in the fine series means are voltage-controlled buffers wherein a delay through a buffer is adjusted when the bias voltage is adjusted, wherein the fine DLL means includes feedback means that adjusts a total delay through the fine series means to match an interval between the K clock and the K+1 clock, the interval being a fraction of the period of the input clock.

* * * * *